United States Patent
Yen et al.

(10) Patent No.: US 6,839,126 B2
(45) Date of Patent: Jan. 4, 2005

(54) PHOTOLITHOGRAPHY PROCESS WITH MULTIPLE EXPOSURES

(75) Inventors: Yeong-Song Yen, Taipei (TW); I-Hsiung Huang, Kaohsiung (TW); Jiunn-Ren Hwang, Hsin-Chu (TW); Kuei-Chun Hung, Hsin-Chu (TW); Ching-Hsu Chang, Yuan-Lin (TW)

(73) Assignee: United Microelectronics Corp. (TW)

( * ) Notice: Subject to any disclaimer, the term of this patent is extended or adjusted under 35 U.S.C. 154(b) by 139 days.

(21) Appl. No.: 10/033,891
(22) Filed: Jan. 3, 2002

(65) Prior Publication Data

US 2003/0123039 A1 Jul. 3, 2003

(51) Int. Cl.⁷ .................. G03B 27/74; G03B 27/42; G03B 27/54
(52) U.S. Cl. .............. 355/68; 355/53; 355/67
(58) Field of Search ............. 355/68, 53, 67, 355/55, 71, 77; 356/400; 250/548; 430/5

(56) References Cited

U.S. PATENT DOCUMENTS

| | | | |
|---|---|---|---|
| 5,703,675 A | * | 12/1997 | Hirukawa et al. ............ 355/53 |
| 2003/0103196 A1 | * | 6/2003 | Hirukawa ................... 355/55 |

* cited by examiner

*Primary Examiner*—Peter B. Kim
(74) *Attorney, Agent, or Firm*—Dickinson Wright PLLC

(57) ABSTRACT

A photolithography process with multiple exposures is provided. A photomask is placed and aligned above a wafer having a photoresist formed thereon at a predetermined distance. Multiple exposures are sequentially performed on the photoresist through the photomask. Each of the multiple exposures is provided with a respective illuminating setting that is optimized for one duty ratio of the photomask. Thereby, an optimum through-pitch performance for pattern transfer from the photomask unto the photoresist is obtained. Then, a development is performed on the photoresist.

29 Claims, 7 Drawing Sheets

PHOTOLITHOGRAPHY PROCESS WITH MULTIPLE EXPOSURES

BACKGROUND OF THE INVENTION

1. Field of the Invention

The present invention relates to a photolithography process, and more particularly to a photolithography process with projection exposure.

2. Description of the Prior Art

Photolithography is a well-known process for transferring geometric shapes present on a mask onto the surface of a silicon wafer. In the field of IC lithographic processing, a photosensitive polymer film called photoresist is normally applied to a silicon substrate wafer and then allowed to dry. An exposure tool is utilized to expose the wafer with the proper geometrical patterns through a mask by means of a source of light or radiation. After exposure, the wafer is treated to develop the mask images transferred to the photosensitive material. These masking patterns are then used to create the device features of the circuit.

A simplified diagram of a conventional exposure tool is shown in FIG. 1. As can be seen, light source 100 projects light waves 108 through opening 102 in aperture stop 101. Opening 102 is commonly referred to as the pupil of the aperture stop. Condenser lens 105 collects the light from the opening 102 and focuses it on mask 106 such that the mask 106 is evenly illuminated. When illuminating beam 103 passes through mask 106, imaging beam 109 is generated. Imaging beam 109 is projected through projection lens 107 such that the image of the pattern on the mask 106 is focused onto the silicon wafer 110. As can be seen in FIG. 1, the opening 102 is situated in the center of aperture stop 101. Because of this, illuminating beam 103 is projected along the optical axis (dashed line 104) from the opening 102 to condenser lens 105 and mask 106. This type of illumination method is called "On-axis illumination,"—the name implying that the illumination beam is "on" the optical axis.

One important limiting characteristic of any exposure tool is its resolution limit. The resolution limit for an exposure tool is defined as the minimum feature that the exposure tool can repeatedly expose onto the wafer, which is close to the smallest dimension (referred to as the critical dimension or CD) for many current IC layer designs.

Another important characteristic of an exposure tool is its depth of focus (DOF). The DOF of an exposure tool is defined as the range in which the aerial image (of a near resolution sized feature) will stay in focus. In a lithographic process in which an image is transferred into a photoresist layer, a minimum DOF is required. This minimum DOF ensures that the image remains sufficiently in focus throughout the photoresist layer. Thus, the minimum DOF range is typically greater than or equal to the thickness of the photoresist layer.

The resolution (R) and the DOF of an exposure tool are proportional to the exposure wavelength ($\lambda$) and are inversely proportional to the numerical aperture ($NA_{lens}$) of a projection optical system of the exposure tool, as shown in the following equations (1) and (2):

$$R = K_1 \frac{\lambda}{NA_{lens}} \quad (1)$$

$$DOF = K_2 \frac{\lambda}{(NA_{lens})^2} \quad (2)$$

The DOF of an exposure tool determines the "usable resolution" setting of the exposure tool. For instance, if an exposure tool is able to resolve 0.4 μm features but has a DOF range less than the range needed to clearly focus this feature throughout the photoresist layer, then the 0.4 μm resolution setting can not be utilized. As can be seen, if the range of DOF of an exposure tool can be extended, the usable resolution limit may be decreased and smaller images may be printed.

Referring to FIG. 1, for the conventional photolithography process, the wafer 110 having a photoresist layer formed thereon is exposed with one fixed illumination setting involving numerical aperture ($NA_{lens}$), sigma value ($\sigma$) and exposure energy to generate enough photo-acid for target critical dimensions (CDs).

Sigma value ($\sigma$) is a coherence factor, a ratio of the numerical aperture ($NA_{ill}$) of the illuminating optical system of the exposure tool to the numerical aperture ($NA_{lens}$) of the projection optical system of the exposure tool, which is represented by the equation (3):

$$\sigma = \frac{NA_{ill}}{NA_{lens}} \quad (3)$$

Referring to FIG. 2A to FIG. 2C, curves A1, A2 and A3 respectively represent the DOF of the dense pattern under illuminating settings from low sigma value (0.35) to high sigma value (0.85) at a constant numerical aperture (NA) 0.68 of the projection optical system. Curves B1, B2 and B3 respectively represent the DOF of the isolated pattern under illuminating settings from low sigma value (0.35) to high sigma value (0.85) at a constant numerical aperture (NA) 0.68 of the projection optical system. It is apparent that the DOF of a dense pattern is extended as sigma value ($\sigma$) is increased. On the contrary, the DOF of an isolated pattern becomes shallower.

During the conventional photolithography process with single illuminating setting, the dense pattern and isolated pattern are simultaneously transferred to the photoresist layer from the same mask. However, the results in FIG. 2A to FIG. 2C show that there is not an illuminating setting that is optimum for both the dense and isolated pattern transfer performance. Besides, for the same mask, the critical dimension (CD) is enlarged by light diffraction when the pitch is small, and the critical dimension (CD) is reduced by optical effect when the pitch is increased. Herein, a pitch of a mask is a distance composed of a line width and a space. The mask error factor (MEF), the ratio of a deviation of the critical dimension of a wafer ($\Delta CD_{wafer}$) to a deviation of the critical dimension of a mask ($\Delta CD_{mask}$), severely impacts on the CD control through all pitches. Therefore, a compromise between the dense and isolated pattern transfer performance should be taken.

A conventional photolithography process with double exposures using two masks is employed to overcome the above problems. However, this process creates another issue regarding the alignment accuracy of the two masks. The throughput of the photolithography process is also decreased.

Since the conventional photolithography process with its single exposure method using single illuminating setting cannot fulfill the optimum illuminating setting for patterns at all pitches, an improved photolithography process using multiple exposures with matching illuminating settings is needed.

SUMMARY OF THE INVENTION

It is an objective of the present invention to provide a photolithography process with multiple exposures, in which each of the multiple exposures is provided with a respective illuminating setting optimized for one duty ratio of a photomask such that the present invention can combine the advantages of different illuminating settings to perform better process capabilities include DOF, proximity and MEF through all pitches. The process window is thus improved.

It is anther objective of the present invention to provide a photolithography process with multiple exposures through a single mask on a photoresist, which provides a better overlay accuracy with a single mask process without mask loading/unloading alignment.

It is a further objective of the present invention to provide a photolithography process with multiple exposures, which is suitable for different wavelengths, including I-line, deep ultraviolet ray, extreme ultraviolet ray, X-ray and ion projection lithography (IPL) etc.

In order to achieve the above objectives, the present invention provides a photolithography process with multiple exposures. A photomask is placed and aligned above a wafer having a photoresist formed thereon at a predetermined distance. Multiple exposures are sequentially performed on the photoresist through the photomask. Each of the multiple exposures is provided with a respective illuminating setting that is optimized for one of the duty ratios of the photomask. Thereby, an optimum through-pitch performance for pattern transfer from the photomask unto the photoresist is obtained. Then, a development is performed on the photoresist.

BRIEF DESCRIPTION OF THE DRAWINGS

The above and other objectives, features and advantages of the present invention will be apparent from the following description with reference to the accompanying drawings.

DESCRIPTION OF THE EMBODIMENTS

The present invention will now be described in conjunction with the accompanying drawings.

The present invention provides a photolithography process with multiple exposures through a single photomask to pattern a photoresist layer formed on a wafer. Each of the multiple exposures is provided with a respective illuminating setting including illuminating parameters of numerical aperture (NA), sigma value (σ), exposure energy, focus position and pupil type of an exposure tool utilized in the multiple exposures. Herein, the numerical aperture (NA) is referred to as the numerical aperture of a projection optical system of the exposure tool, and the sigma value is referred to as the sigma value of an illuminating optical system of the exposure tool. All the illuminating parameters can be obtained by adjusting the settings of the exposure tool. It should be noted that each of the multiple exposures is performed with a respective illuminating setting that is optimized for a specific duty ratio, a ratio of pitch to critical dimension (CD), of the photomask. Accordingly, the present invention can combine the respective pattern transfers of the multiple exposures to obtain a good through-pitch pattern transfer performance.

Figure 1:
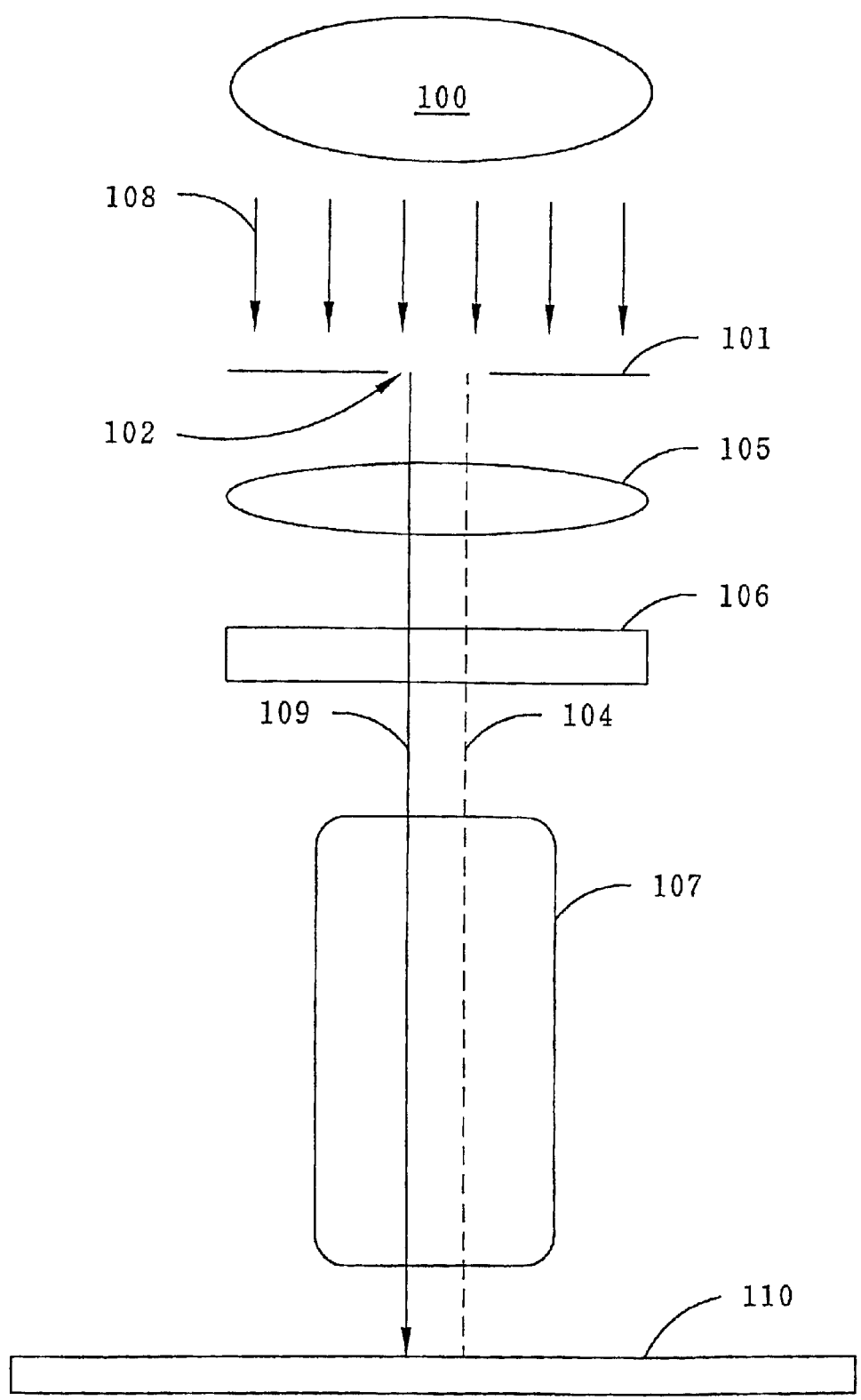
FIG. 1 illustrates a simplified exposure tool having on-axis illumination.
Figure 2A:
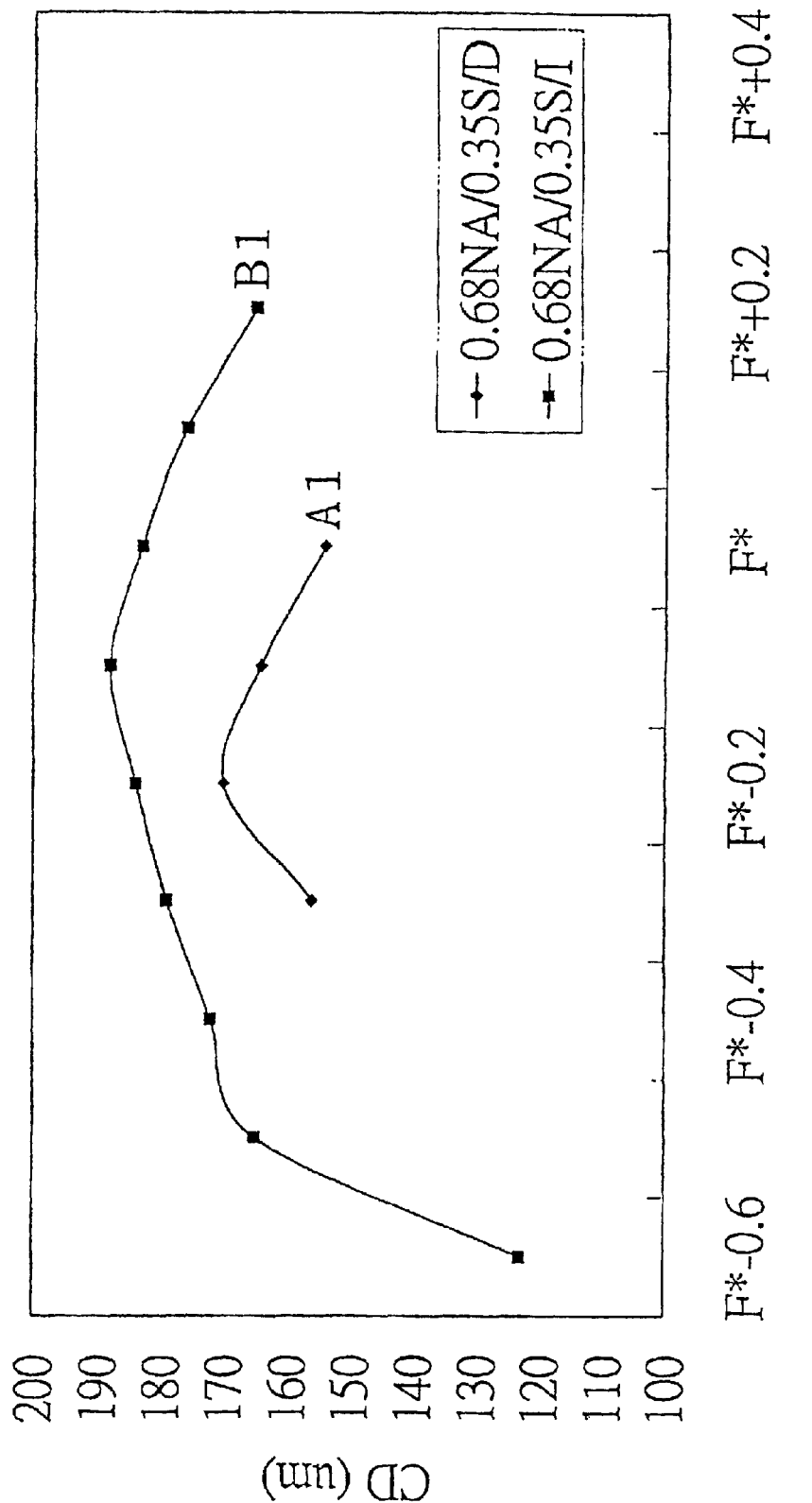
FIG. 2A to FIG. 2C show diagrams of CD vs. focus of an exposure tool for an isolated pattern and a dense pattern obtained by a conventional photolithography process, respectively under an illuminating setting having a low sigma value, a medium sigma value and a high sigma value.
Figure 2B:
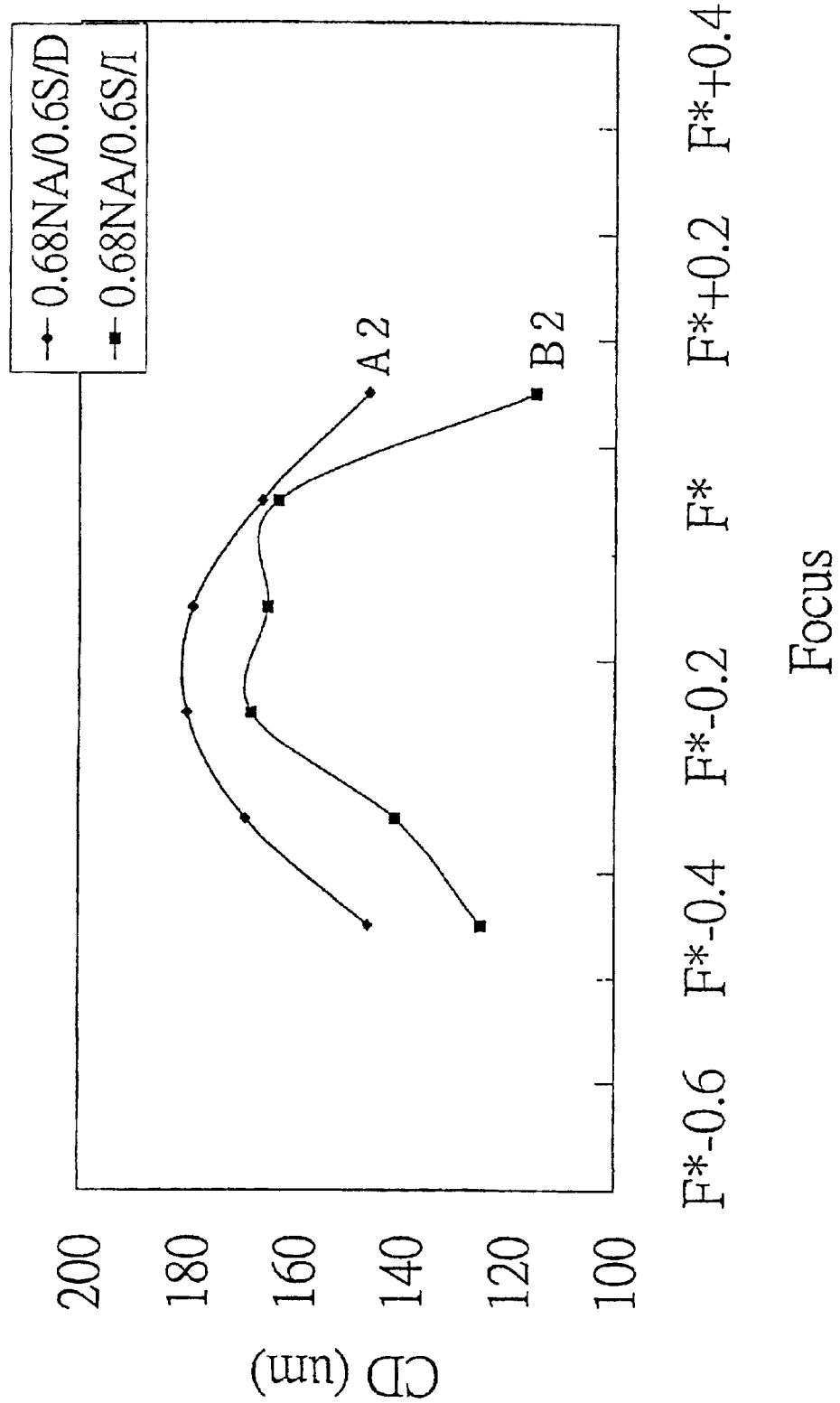
Figure 2C:
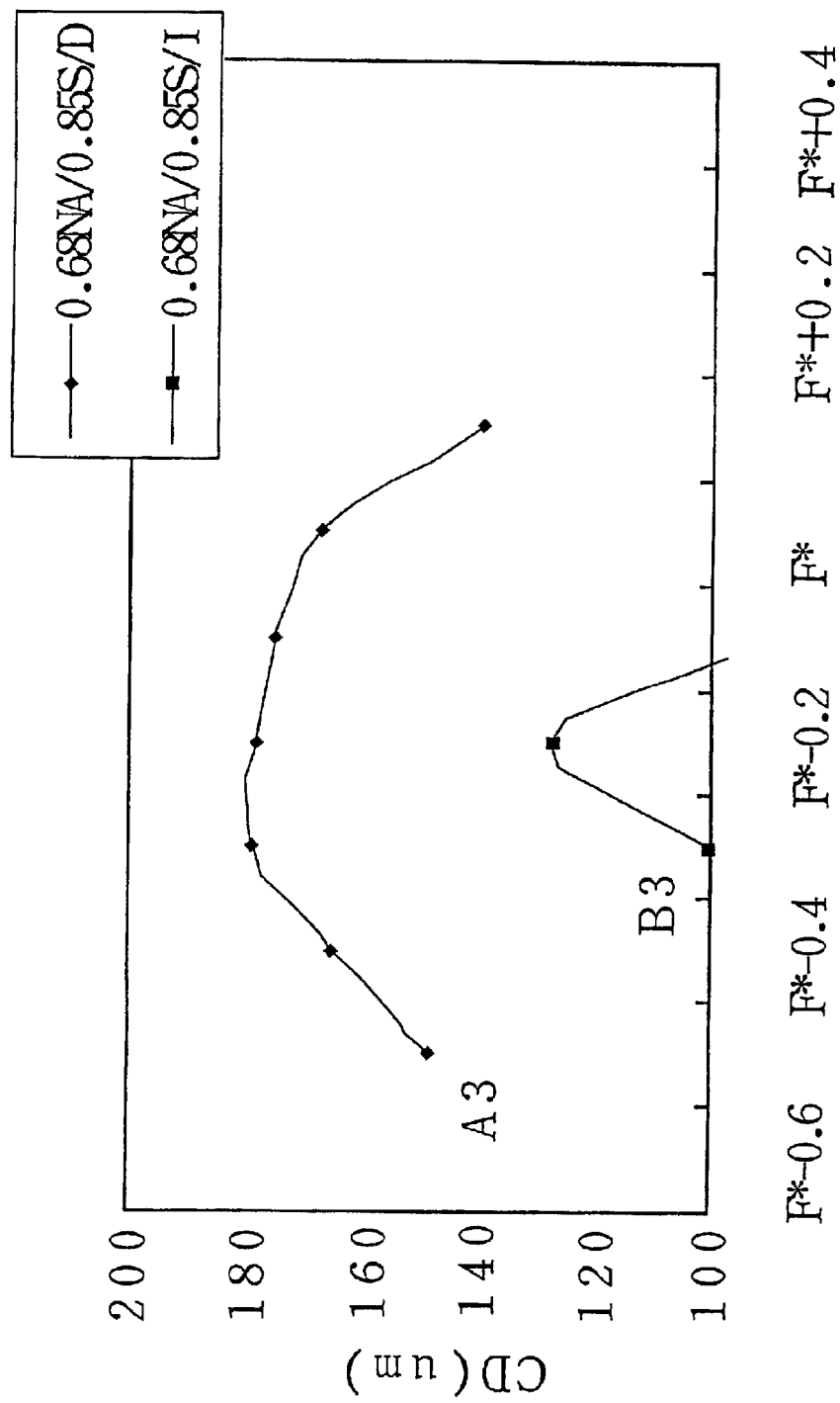
Figure 3:
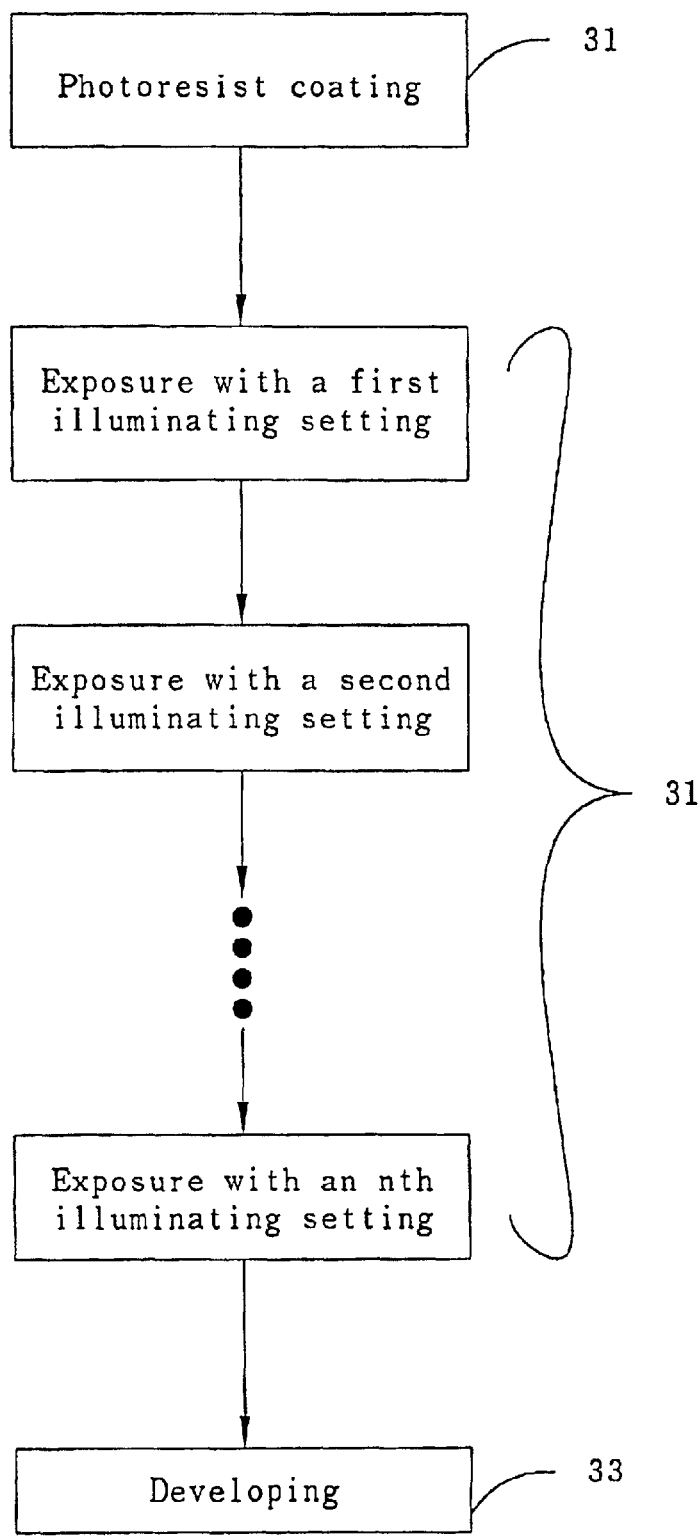
FIG. 3 is a flow chart of a photolithography process according to the present invention.

FIG. 3 shows a flow chart of a photolithography process with multiple exposures according to the present invention. In step 31, a photoresist is firstly formed on a wafer. The method of forming the photoresist includes spin coating. A photomask is then disposed and aligned over the wafer at a proper distance. The photomask has a pattern that is replicated into the photoresist. The pattern has a set of specific duty ratios, i.e., a set of ratios of pitch to critical dimension (CD).

Next, in step 32, multiple exposures including a first exposure to nth exposure are sequentially performed through the photomask on the wafer having the photoresist formed thereon. The times of the exposure step are determined in accordance with the set of duty ratios of the photomask. A first exposure is performed with a first illuminating setting that is optimized for one of the duty ratios of the photomask by adjusting the setting of the exposure tool. A second exposure is next performed with a second illuminating setting that is optimized for another duty ratio of the photomask. The exposure step is repeatedly performed with different illuminating settings until all of the duty ratios of the photomask are fulfilled. A resulting pattern transfer combining all the respective pattern transfers of the multiple exposures is thus obtained. Since each exposure step is provided with a specific illuminating setting optimized for one duty ratio of the photomask, a good through-pitch performance for pattern transfer is obtained by the present invention.

In step 33, the multiple exposures are followed by a developing step. The development of the photoresist can be performed with a known method, such as dry development and wet development.

It should be noted that the multiple exposures of the present invention are suitable for different wavelengths, including I-line, deep ultraviolet ray, extreme ultraviolet ray, X-ray and ion projection lithography (IPL) etc.

As described in the technical background, if the range of DOF of an exposure tool can be extended, the usable resolution limit of the exposure tool may be decreased and smaller images may be printed on the photoresist. Additionally, the DOF of an exposure tool for a dense pattern (the duty ratio is small) is extended as the sigma value (σ) of the exposure tool is increased while the DOF of the exposure tool for an isolated pattern (the duty ratio is large) becomes shallower.

Figure 4A:
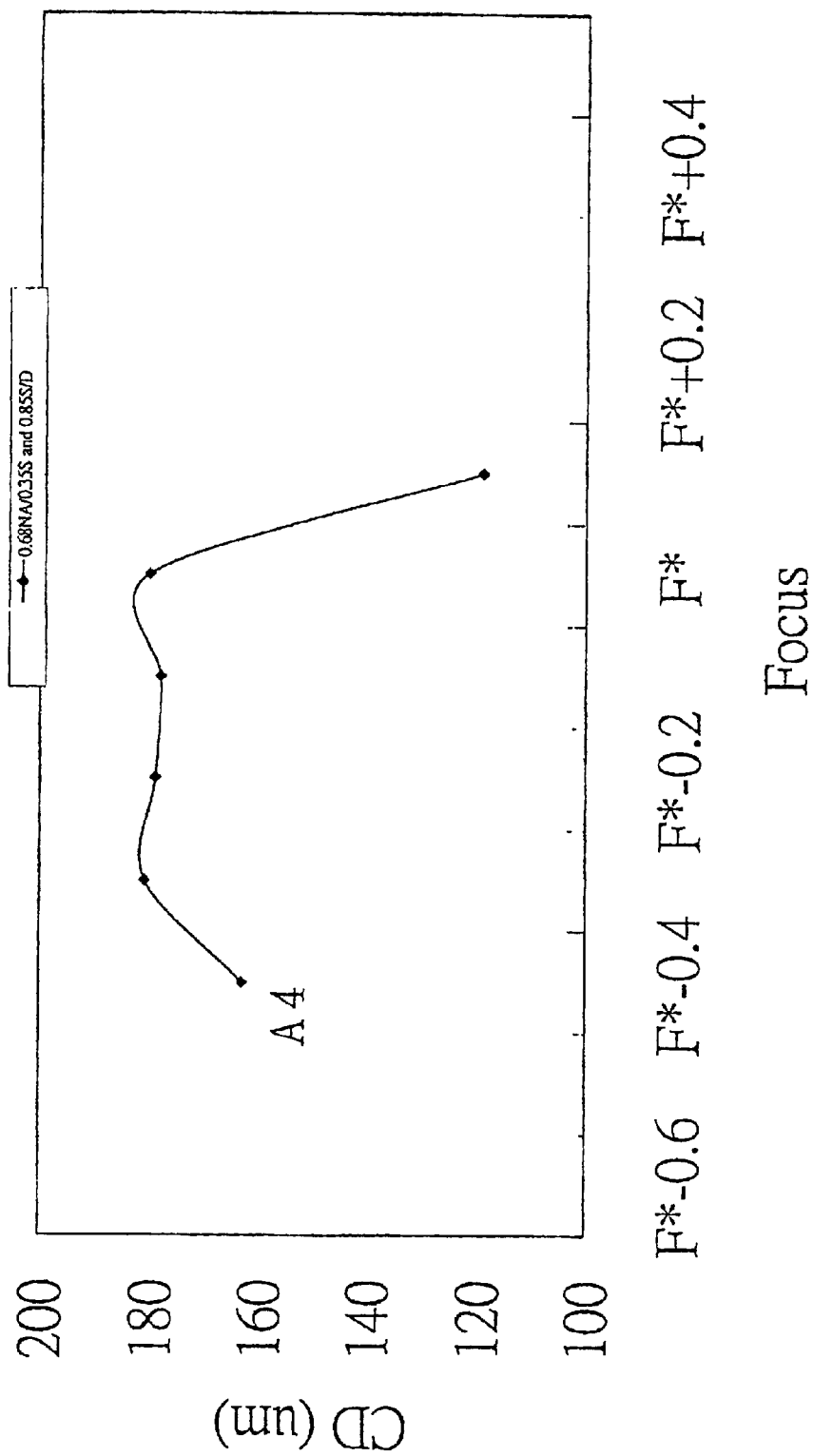
FIG. 4A shows a diagram of CD vs. focus of an exposure tool according to a first embodiment of the present invention.

In a first embodiment of the present invention, a first exposure with a high sigma value (σ) about 0.85 and a numerical aperture about 0.68, which is better for a dense pattern transfer, is performed on the photoresist through a photomask having a dense pattern and an isolated pattern formed therein. A second exposure with a low sigma of about 0.35 and a numerical aperture of about 0.68, which is better for the isolated pattern transfer, is then performed on the photoresist through the photomask. A resulting pattern transfer combining the respective pattern transfers of the first exposure and the second exposure is thus obtained. FIG. 4A shows a combination effect of the first exposure and the second exposure of the first embodiment, which is a diagram of critical dimension (CD) vs. focus of an exposure tool utilized in these two exposure steps. It is apparent that the DOF of the exposure tool is extended, compared with the conventional photolithography process with a single illuminating setting.

The first and second exposures of the first embodiment can be interchangeably performed.

An alternative way to reduce the usable resolution of an exposure tool by extending its associated DOF range is to employ an off-axis illumination (OAI) technique. The off-axis illumination projects an illuminating beam at an angle other than that of the optical axis, the DOF of the exposure tool thus can be extended. The off-axis illumination type can be a quadruple type illumination, an annular type illumination, a dipole type illumination, etc. However, the off-axis illumination significantly increases the DOF range of the exposure tool for the dense pattern but provides little DOF improvement for the isolated pattern. In a second embodiment of the present invention, the advantages of off-axis illumination for the dense pattern and low sigma value for the isolated pattern are combined.

Figure 4B:
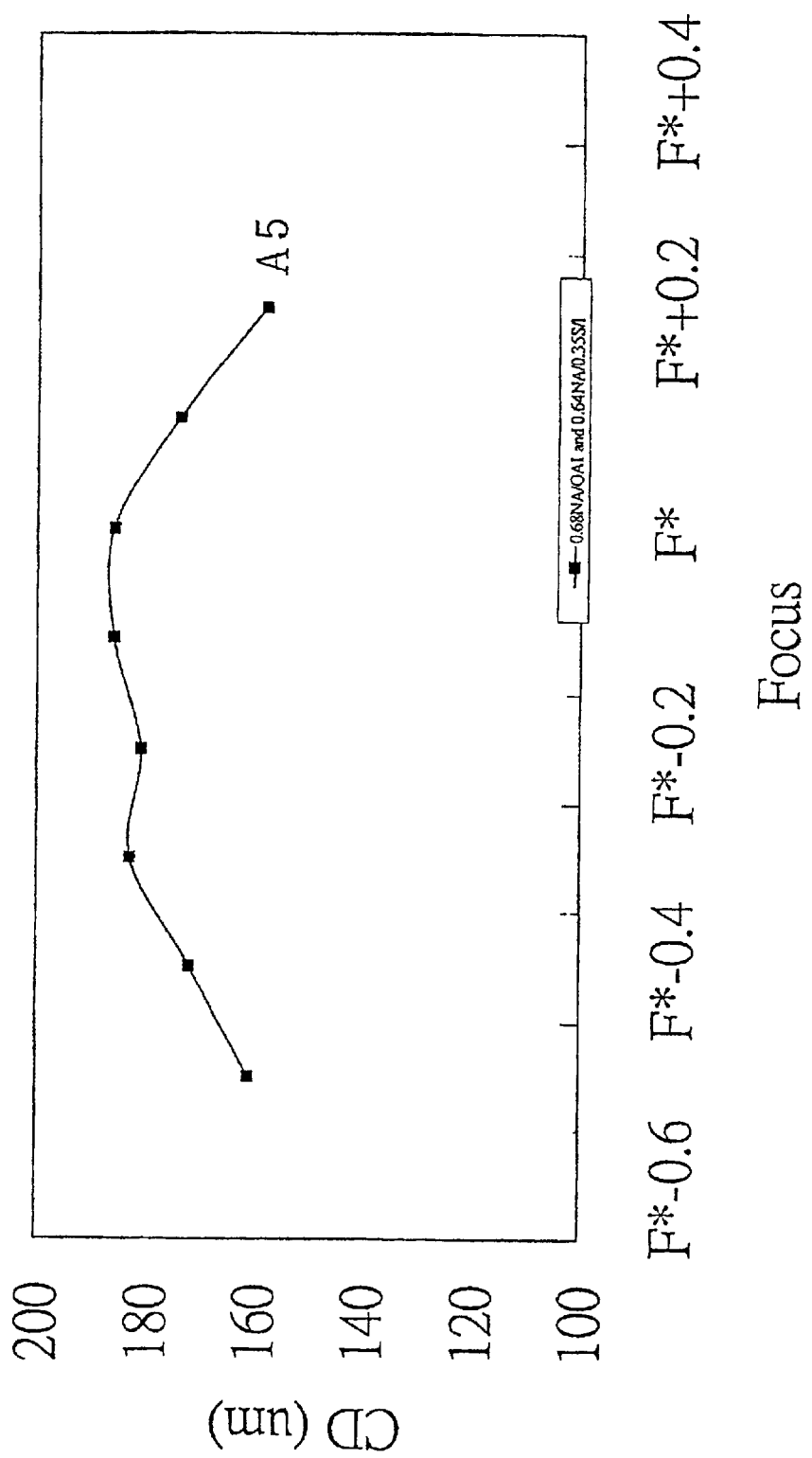
FIG. 4B shows a diagram of CD vs. focus of an exposure tool according to a second embodiment of the present invention.

In the second embodiment of the present invention, a first exposure with off-axis illumination and a numerical aperture of about 0.68, which is better for a dense pattern transfer, is performed on the photoresist through a photomask having a dense pattern and an isolated pattern formed therein. The off-axis illumination type can be selected by changing a pupil type of an illuminating optical system of an exposure tool utilized in the second embodiment. A second exposure with a low sigma value of about 0.35 and a numerical aperture of about 0.64, which is better for the isolated pattern transfer, is then performed on the photoresist through the photomask. A resulting pattern transfer combining the respective pattern transfers of the first exposure and the second exposure is thus obtained. FIG. 4B shows a combination effect of the first exposure and the second exposure of the second embodiment, which is a diagram of critical dimension (CD) vs. focus of an exposure tool utilized in these two exposure steps. As shown in FIG. 4B, the DOF of an exposure tool is significantly extended, compared with the conventional photolithography process with a single illuminating setting.

The first and second exposures of the second embodiment can be interchangeably performed.

The present photolithography process with multiple exposures utilizes different illuminating settings for a single mask can combine the advantages of the different illuminating settings together to obtain better photolithographic performance. A better overlay accuracy with a single mask process without mask loading/unloading and alignment can be provided by the present invention. Moreover, the process window of a photolithography process is also improved through extending the DOF range of the exposure tool by the present invention.

The embodiments are only used to illustrate the present invention, and are not intended to limit the scope thereof. Many modifications of the embodiments can be made without departing from the spirit of the present invention.

What is claimed is:

1. A photolithography process with multiple exposures, comprising:

providing a wafer having a photoresist formed thereon;

providing a photomask aligned above said wafer at a predetermined distance;

sequentially performing multiple exposures on said photoresist through said photomask, each of said multiple exposures provided with a respective illuminating setting optimized for one duty ratio of said photomask, thereby obtaining an optimum through-pitch performance for pattern transfer onto said photoresist from said photomask; and performing a development on said photoresist.

2. The photolithography process with multiple exposures as claimed in claim 1, wherein said multiple exposures are performed by an exposure tool.

3. The photolithography process with multiple exposures as claimed in claim 2, wherein said respective illuminating setting comprises illuminating parameters including numerical aperture, sigma value, focus, pupil type and exposure energy of said exposure tool.

4. The photolithography process with multiple exposures as claimed in claim 1, wherein said multiple exposures are performed with an illuminating wavelength selected from I-line, deep ultraviolet ray, extreme ultraviolet ray, X-ray and ion projection lithography (IPL).

5. The photolithography process with multiple exposures as claimed in claim 2, wherein said multiple exposures are performed with an illuminating wavelength selected from I-line, deep ultraviolet ray, extreme ultraviolet ray, X-ray and ion projection lithography (IPL).

6. A photolithography process with double exposures, comprising:

providing a wafer having a photoresist formed thereon;

providing a photomask with a dense pattern and an isolated pattern formed therein aligned above said wafer at a predetermined distance;

performing a first exposure through said photomask with a first illuminating setting optimized for said dense pattern transfer unto said photoresist from said photomask;

performing a second exposure through said photomask with a second illuminating setting optimized for said isolated pattern transfer unto said photoresist from said photomask; and performing a development on said photoresist.

7. The photolithography process with double exposures as claimed in claim 6, wherein both of said first exposure and said second exposure are performed by an exposure tool.

8. The photolithography process with double exposures as claimed in claim 7, wherein said first illuminating setting comprises illuminating parameters including numerical aperture, sigma value, focus, pupil type and exposure energy of said exposure tool.

9. The photolithography process with double exposures as claimed in claim 7, wherein said second illuminating setting comprises illuminating parameters including numerical aperture, sigma value, focus, pupil type and exposure energy of said exposure tool.

10. The photolithography process with double exposures as claimed in claim 6, wherein said first illuminating setting comprises an off-axis illumination (OAI).

11. The photolithography process with double exposures as claimed in claim 7, wherein said first illuminating setting comprises an off-axis illumination (OAI).

12. The photolithography process with double exposures as claimed in claim 7, wherein said first illuminating setting comprises a sigma value of said exposure tool not less than 0.85.

13. The photolithography process with double exposures as claimed in claim 7, wherein said second illuminating setting comprises a sigma value of said exposure tool not more than 0.35.

14. The photolithography process with double exposures as claimed in claim 7, wherein said first illuminating setting comprises an off-axis illumination (OAI) and said second illumination setting comprises a sigma value of said exposure tool not more than 0.35.

15. The photolithography process with double exposures as claimed in claim 7, wherein said first illuminating setting comprises a sigma value of said exposure tool not less than 0.85 and said second illumination setting comprises a sigma value of said exposure tool not more than 0.35.

16. The photolithography process with double exposures as claimed in claim 6, wherein said first exposure and said second exposure are performed with an illuminating wavelength selected from I-line, deep ultraviolet ray, extreme ultraviolet ray, X-ray and ion projection lithography (IPL).

17. The photolithography process with double exposures as claimed in claim 7, wherein said first exposure and said second exposure are performed with an illuminating wavelength selected from I-line, deep ultraviolet ray, extreme ultraviolet ray, X-ray and ion projection lithography (IPL).

18. A photolithography process with double exposures, comprising:

providing a wafer having a photoresist formed thereon;

providing a photomask with an isolated pattern and a dense pattern formed therein aligned above said wafer at a predetermined distance;

performing a first exposure through said photomask with a first illuminating setting optimized for said isolated pattern transfer unto said photoresist from said photomask;

performing a second exposure through said photomask with a second illuminating setting optimized for said dense pattern transfer unto said photoresist from said photomask; and performing a development on said photoresist.

19. The photolithography process with double exposures as claimed in claim 18, wherein both of said first exposure and said second exposure are performed by an exposure tool.

20. The photolithography process with double exposures as claimed in claim 19, wherein said first illuminating setting comprises illuminating parameters including numerical aperture, sigma value, focus, pupil type and exposure energy of said exposure tool.

21. The photolithography process with double exposures as claimed in claim 19, wherein said second illuminating setting comprises illuminating parameters including numerical aperture, sigma value, focus, pupil type and exposure energy of said exposure tool.

22. The photolithography process with double exposures as claimed in claim 18, wherein said second illuminating setting comprises an off-axis illumination (OAI).

23. The photolithography process with double exposures as claimed in claim 19, wherein said second illuminating setting comprises an off-axis illumination (OAI).

24. The photolithography process with double exposures as claimed in claim 19, wherein said second illuminating setting comprises a sigma value of said exposure tool not less than 0.85.

25. The photolithography process with double exposures as claimed in claim 19, wherein said first illuminating setting comprises a sigma value of said exposure tool not more than 0.35.

26. The photolithography process with double exposures as claimed in claim 19, wherein said first illuminating setting comprises a sigma value of said exposure tool not more than 0.35 and said second illumination setting comprises an off-axis illumination (OAI).

27. The photolithography process with double exposures as claimed in claim 19, wherein said first illuminating setting comprises a sigma value of said exposure tool not more than 0.35 and said second illumination setting comprises a sigma value of said exposure tool not less than 0.85.

28. The photolithography process with double exposures as claimed in claim 18, wherein said first exposure and said second exposure are performed with an illuminating wavelength selected from I-line, deep ultraviolet ray, extreme ultraviolet ray, X-ray and ion projection lithography (IPL).

29. The photolithography process with double exposures as claimed in claim 19, wherein said first exposure and said second exposure are performed with an illuminating wavelength selected from I-line, deep ultraviolet ray, extreme ultraviolet ray, X-ray and ion projection lithography (IPL).

* * * * *